United States Patent [19]
Tatoh

[11] Patent Number: 5,175,783
[45] Date of Patent: Dec. 29, 1992

[54] OPTICAL MOLDED DEVICE INCLUDING TWO LENSES AND ACTIVE ELEMENT INTEGRALLY

[75] Inventor: Nobuyoshi Tatoh, Yokohama, Japan

[73] Assignee: Sumitomo Electric Industries, Ltd., Osaka, Japan

[21] Appl. No.: 680,236

[22] Filed: Apr. 3, 1991

[30] Foreign Application Priority Data

| Apr. 3, 1990 | [JP] | Japan | 2-88566 |
| Apr. 3, 1990 | [JP] | Japan | 2-88567 |
| Apr. 3, 1990 | [JP] | Japan | 2-88568 |
| Apr. 4, 1990 | [JP] | Japan | 2-89891 |
| Apr. 4, 1990 | [JP] | Japan | 2-89892 |
| Apr. 4, 1990 | [JP] | Japan | 2-89893 |
| Sep. 17, 1990 | [JP] | Japan | 2-246705 |

[51] Int. Cl.$^5$ ............................. G02B 6/32; H01J 5/16
[52] U.S. Cl. ........................................ 385/93; 385/92; 385/88; 385/33; 385/35; 250/227.11
[58] Field of Search ............... 350/96.10, 96.11, 96.15, 350/96.17, 96.18, 96.20; 250/227.11, 227.20; 385/31, 33, 35, 88, 92, 93, 94, 49; 264/1.5, 2.5, 2.7, 1.1

[56] References Cited

U.S. PATENT DOCUMENTS

| 4,433,898 | 2/1984 | Nasiri | 385/93 X |
| 4,653,847 | 3/1987 | Berg et al. | 385/93 X |
| 4,699,453 | 10/1987 | Roberts | 385/47 |
| 4,705,351 | 11/1987 | Toda | 385/33 X |
| 4,875,750 | 10/1989 | Spaeth et al. | 385/35 |
| 4,946,242 | 8/1990 | Tanno et al. | 385/88 |
| 5,073,047 | 12/1991 | Suzuki et al. | 385/93 |
| 5,074,682 | 12/1991 | Uno et al. | 385/93 |
| 5,093,879 | 3/1992 | Bregman et al. | 385/93 |

FOREIGN PATENT DOCUMENTS

| 0205359 | 12/1986 | European Pat. Off. | 385/93 X |
| 0081554 | 2/1989 | European Pat. Off. | 350/96.18 X |
| 2428328 | 1/1980 | France | 385/93 X |
| 58-96783 | 6/1983 | Japan | 385/93 X |
| 62-139367 | 6/1987 | Japan | 385/93 X |
| 63-131586 | 6/1988 | Japan | 385/93 X |
| GB89/00792 | 1/1990 | PCT Int'l Appl. | 385/93 X |
| 474201 | 11/1966 | Switzerland | 385/93 X |
| 1195547 | 6/1970 | United Kingdom | 385/93 X |
| 2026235 | 1/1980 | United Kingdom | 385/93 X |
| 2046472 | 11/1980 | United Kingdom | 385/93 X |

OTHER PUBLICATIONS

Patent Abstracts of Japan, vol. 4, No. 170, Nov. 22, 1980.
Patent Abstracts of Japan, vol. 12, No. 328, Sep. 6, 1988.
Patent Abstracts of Japan, vol. 13, No. 136, Apr. 5, 1989.
Patent Abstracts of Japan, vol. 7, No. 216, Sep. 24, 1983.
Patent Abstracts of Japan, vol. 4, No. 51, Apr. 17, 1980.
Patent Abstracts of Japan, vol. 10, No. 251, Aug. 28, 1986.
P. Chambon, Les Composants d'extremites dan les reseaux de videocommunications par fibre optique, L'onde Electrique, vol. 68, No. 3, mai 1988, pp. 50–53, Paris, France.

*Primary Examiner*—Brian Healy
*Attorney, Agent, or Firm*—Cushman, Darby & Cushman

[57] ABSTRACT

This invention relates to an optical device including an optical active device mounted on a frame and integrated by a transparent resin molding as mounted on the frame, the optical device comprising two or more lenses buried in the resin molding facing to the active surface of the optical active device and having an optical axis which coincides with an optical axis of an incident or emitting light of the optical active device.

49 Claims, 21 Drawing Sheets

OPTICAL MOLDED DEVICE INCLUDING TWO LENSES AND ACTIVE ELEMENT INTEGRALLY

BACKGROUND OF THE INVENTION

1. Field of the Invention

This invention relates to light emitting devices, such as Laser Diodes (LDs) or others; photodetecting devices, such as PIN Photo Diodes (PINPDs), Avalanche Photo Diode (APD) or others; an optical electric integrated circuits(OEICs) which integrate optical active devices, such as LDs, LEDs, PINPDs, APDs, etc. and electric devices, such as amplifiers, drivers, FETs and others.

2. Related Background Art

Conventionally in, e.g., light emitting devices for this use, various devices have been made for the purpose of collecting radiation from diode chips by lenses or other means to improve the coupling efficiency to optical fibers or others, and the precision of aligning optical axes with those of the optical fibers or others.

The light emitting device of FIG. 24A (Japanese Patent Laid-Open Publication No. 139367/1987) comprises a diode chip 62 mounted on a can-type package 61, and a spherical lens 62 adhered to a light emitting surface 62a of this chip 62. The package 61 is sealed by a glass cap 64. The light emitting device of FIG. 24B includes another ball lens 66 attached to the center of the cap 64. The cap 65 is adhered to the package 61 to seal the chip 62 air-tightly to thereby make up a lens system on the optical axis of the chip 62.

The light emitting device of FIG. 25 (Japanese Patent Laid-Open Publication No. 139367/1987) comprises a stem 72 with a diode chip 71 mounted on, and a plastic cap 73 adhered to the stem 72 for air-tight sealing of the diode chip 71. A spherical chip coat 74 is applied to the side of the light emitting surface 71a of the diode chip 71, while an emission surface 73a of the plastic cap 73 is formed in a lens-shape to make up a lens system.

FIG. 26 (Japanese Patent Laid Open Publication No. 88377/1987) shows the conventional LED collimator (light emitting diode) for aligning optical axis with that of an optical fiber with high precision. This collimator comprises a stem 82 with a light emitting diode 81 mounted on, a stepped sleeve 83 adhered to the stem 82 for sealing the light emitting diode 81. In this stepped sleeve 83, a ball lens 84 at the middle portion thereof, and a restricted portion 85 is disposed on the front thereof. In this restricted portion 85 is fixedly inserted an optical fiber F.

FIG. 27 (Japanese Patent Laid-Open Publication No. 73786/87) shows the conventional light emitting device for enhancing the coupling efficiency with optical fibers.

This light emitting device comprises a frame 91 having the head 92 made of metal, such as aluminum, or others. A concave groove 92a is formed in the middle of the head 92. A light emitting diode 93 is rested in the concave groove 92a. The concave groove 92a has the wall formed in a curved surface. This curved face is a reflection surface 92b. These members are integrated by resin molding. Consequently diagonally horizontally reflected light which is usually loss light is reflected forward by the reflection surface 92b.

The emission surface 94a of the resin molding 94 is formed in a semisphere to function as a lens, so that radiation is converged there.

Thus, the reflection surface 92b decreases light loss to remove uneven luminance and enables the emission surface 94a to positively condense light.

The light emitting diode of FIG. 24 has the problem that the diode chip 62 is air-tightly packaged, which requires a number of parts, and its fabrication process is accordingly complicated. Besides the light emitting diode of FIG., 24B needs aligning the optical axis of the diode chip 62 with those of the ball lenses 63, 64, and in welding the cap 65 to the package 61, their positioning needs considerably high precision. The fabrication process is accordingly complicated, and resultantly its fabrication cost goes up.

In the light emitting diode of FIG. 25 as well, considerable precision is required in welding the plastic cap 73 with the lens system to the stem with the diode chip 71 mounted on, and the fabrication process is complicated.

In the light emitting device of FIG. 26, it is necessary to agree with good precision the optical axis of the light emitting diode 81 with the center of the end surface of an optical fiber F for the purpose of enhancing the coupling efficiency in adhering the stepped sleeve 83 with a restricted portion 85 for fixing the optical fiber F. This precision depends on a precision of positioning the stepped sleeve 83 to the stem 82. Accordingly considerable precision is required, which makes the fabrication process of the light emitting device complicated. This has incurred high fabrication costs.

In the light emitting device of FIG. 27, the portion for removing light loss, and the portion for positively condensing radiation are separately constituted. This makes the structure of the device and its fabrication process complicated. When the light emitting diode 93 is die-bonded, the head 92 of the frame 91 providing the reflection surface 92b is heated, adversely making the reflection surface 92b rough, with the result of lowered reflection efficiency.

SUMMARY OF THE INVENTION

In view of these circumstances this invention has been made, and an object of this invention is to provide an optical device which can be easily coupled with optical fibers, etc. with a required coupling precision, and has a simple structure and high condensation.

For achieving this object, this invention has the following characteristics. That is, an optical device according to this invention, including an optical active device mounted on a frame and integrated by a molding of a light-transmitting resin; an optical active device buried in the light-transmitting resin molding as mounted on the frame; and two lenses buried in the light-transmitting resin molding facing to an active surface of the optical active device and having an optical axis which coincides with an optical axis an incident or emitting light of the optical active device. A plurality of lenses buried in the resin molding facing to the active surface of the optical active device enhance the condensation. These lenses are buried in the resin molding, and consequently the lenses are kept from the outside environmental changes, and are stable against vibrations, etc. The resin molding can easily form the optical active device in arbitrary shapes, while decreasing a number of parts.

In these features of this invention, one of the lenses positioned on the side of the optical active device is adhered to the active surface of the optical active device. Consequently there is little possibility that the lens is dislocated in the resin-molding operation, and the molding is easy.

In these features of this invention, the incidence or emission surface of the resin molding is formed in a convex surface functioning as a lens. Consequently the incident or the emission light with respect to the optical device can be converged on two stages by the lens buried facing to the optical active surface, and the convex surface formed on the incidence or emission surface of the resin molding. This lens, and the incident or emission surface are resin-molded or provided by resin moldings, and consequently alignment of the optical axes can be easily conducted with high precision and the whole device can be easily fabricated.

The optical device according to this invention, comprising an optical active device mounted on a frame and integrated by a light-transmitting resin molding comprises two or more lenses positioned facing to an optical active surface of the optical active device and having an optical axis which coincides with an optical axis of an incident or emitting light of the optical active device, one of the lenses being attached to an incidence or emission surface of the resin molding, and the other of the lenses being buried in the resin molding. Consequently the condensation can be enhanced by one of the lenses buried facing to the active surface of the optical active device, and the other of the lenses attached to the concave groove in the surface of the resin molding. The other lens is attached to the concave groove formed by the resin-molding, and consequently the other lens can be positioned with high precision and easily attached.

The optical device according to this invention, comprising an optical active device mounted on a frame and integrated by a light-transmitting resin molding comprises a fixation groove provided in the resin molding facing to an incidence or emission surface and having an optical axis thereof for an optical fiber to be inserted on the same which coincides with an optical axis of an incident or emitting light of the optical active device.

By fixedly inserting the forward end of an optical fiber in the fixation groove for the optical fiber, the optical axis of the optical active device and the optical fiber can be automatically aligned, using no special jig or other means. The fixation groove can be formed integrally with the optical active device in the resin-molding. Consequently the optical device can be easily fabricated. The fixation groove and the optical active device can be integrally formed, which makes it unnecessary to align the optical axes in the fabrication. Consequently an optical fiber can be easily attached.

In these features of this invention, lenses are buried in that of the resin molding between the active surface of the optical active device and the incidence or emission surface of the resin molding, i.e., the groove bottom of the fixation groove, and the incidence or emission surface of the resin molding, i.e., the groove bottom of the fixation groove, are formed in convex surfaces functioning as lenses. Consequently incident or emitting light with respect to the optical active device is condensed, and coupling efficiency with optical fibers is enhanced.

In these features of this invention, the entrance of the fixation groove is beveled. Consequently an optical fiber can be inserted smoothly into the fixation groove.

In these features of this invention, the fixation groove has an regular triangle section. Consequently a optical fiber of circular section contacts the fixation groove of regular triangular section at three points, and the alignment of the optical axes can be conducted with high precision.

In this feature, the fixation groove comprises a V-shaped groove formed in a Si substrate embedded in the resin molding, and a plate attached to the Si substrate so as to close the V-shaped groove. Owing to this arrangement, the fixation groove of regular triangular section can be formed with high precision.

The optical device according to this invention, comprising a plurality of optical active devices mounted on a frame and integrated by a light-transmitting resin molding comprises a light-transmitting resin molding; a plurality of optical active devices buried in the light-transmitting resin molding as mounted on a frame in alignment; and fixation grooves provided in the resin molding facing to an incidence or emission surface thereof for optical fibers to be inserted, and having an optical axis which coincides with an optical axis of coincident or emitting light of the optical active devices, the fixation grooves comprising a plurality of V-shaped grooves formed in a Si substrate, and plates adhered to the Si substrate so as to close the V-shaped grooves.

By inserting optical fibers in the respective fixation grooves for optical fibers, which has inverse triangular section constituted by the V-shaped groove and the plate, the optical axes of the optical fibers and their associated optical active devices can be aligned. A plurality of V-shaped grooves are formed in the Si substrate, which retains the precision of aligning the optical axes, also facilitates the fabrication of an array of the optical devices.

In these features of this invention, the lenses are spherical lenses, preferably ball lenses. It facilitates the alignment of the optical axes in the resin-molding and the adhesion to provide the lenses by ball lenses.

In features of this invention, it is preferable that the lenses are non-spherical lenses, the refractive indexes of the lenses are higher than the refractive index of the resin molding, the lenses are glass lenses, and the glass lenses are made of $TiO_2$ glass, $BaO_2$ glass or $SiO_2$ glass as main components.

Owing to these features, high condensation can be obtained by using various different lenses.

In features of this invention, it is preferable that the lenses are a light-transmitting semiconductor, and especially the semiconductor device comprises InP or GaAs as a main component. In this case, the lenses have high refractive indexes and do not absorb UV radiation, and the optical device is useful for UV radiation.

In features of this invention, it is preferable that the incidence or emission surface is spherical, and the incidence or emission surface is formed in stepped surfaces as a Fresnel lens. Owing to these features, optimum condensation, and suitable general shapes can be obtained.

The optical device according to this invention, comprising an optical active device mounted on a frame and integrated by a light-transmitting resin molding comprises a convex surface functioning a lens formed on the resin molding facing to the active surface of the optical active device, and a reflection layer constituting a reflection mirror on the convex surface.

The convex surface formed to function as a lens does the function of a concave mirror as well as the reflection layer of the convex surface. Accordingly the incident or emitting light with respect to the optical active device is reflected against the reflection layer to be condensed. The reflection layer can be formed on the exterior of the convex surface, and accordingly it is very easy to make the reflection layer highly refractive.

In these advantageous features of this invention, it is preferable that the convex surface constituting the reflection layer is spherical, the convex surface forming the reflection layer is an elliptical ball surface, the convex surface forming the reflection layer is a parabolic surface, and the convex surface forming the reflection layer is a stepped surface as a Fresnel lens.

Owing to these features, the reflection layers respectively provide a convex mirror, an elliptical ball surface mirror, a parabolic mirror and a Fresnel mirror, whereby high condensation can be obtained.

In features of this invention, it is preferable that the lenses are buried in the resin molding facing to the incidence or emission surface, the lenses are adhered to the entrance and exit surface of the resin molding, and the incidence and emission surface of the resin molding is formed in a convex surface functioning as a lens.

The incident light or the emitting light with respect to the optical device is condensed on two stages by the reflection layer, the lens buried in the resin molding, the lens attached to the resin molding or the convex surface. The lenses are attached by the molding. Consequently the fabrication of the optical active device, and the alignment of the optical axes is easy. On the other hand, the convex surface can be very easily formed by the resin-molding.

In these features, it is preferable that the incidence or emission surface is spherical; the incidence or emission surface is elliptical ball surface; the incidence or emission surface is parabolic; and the incidence or emission surface is a stepped surface as a Fresnel lens.

Owing to these features, the entrance and exit surface as well as the reflection layer can have good condensation.

In an feature of this invention, in the resin molding on the side of the incidence or emission surface thereof there is provided a fixation groove for an optical fiber to be inserted having an optical axis which coincides with an optical axis of an incident or emitting light the optical active device. Consequently the forward end of an optical fiber can be fixedly inserted in the fixation groove, and the optical axes alignment with the optical fiber is easy.

In this feature, it is preferable that a substantial center of a groove bottom of the fixation groove for the optical fiber is positioned at or near a focal point of light reflected against the reflection layer.

The fixation groove receives and fixes the forward end of an optical fiber, whereby the center of the end surface of an optical fiber is opposed automatically to a condensation point of the radiation from the active surface of the optical active device, or near the same. Reversely, the incident light from the optical fiber is condensed efficiently by the active surface of the optical active device.

In the feature that the convex surface constituting the reflection layer is an elliptical ball surface, it is preferable that in the resin molding on the side of the incidence or emission surface thereof there is provided a fixation groove for an optical fiber to be inserted, having an optical axis which coincides with an optical axis of an incident or emitting light of the optical active device; and a substantial center of the active surface of the optical active device is positioned at a first focal point of the elliptical ball and a substantial center of a groove bottom of the fixation groove is positioned at a second focal point.

Consequently all the diffuse radiation from the active surface of the optical active device is focussed without failure at the substantial center of the fixation groove, i.e., at a position where the forward end of the optical fiber is located. Reversely the incident light from the optical fiber is condensed efficiently on the active surface of the optical active device.

In the above-described features of this invention, it is preferable that an attachment flange is formed on a part of the resin molding. In this case, the attachment of the optical device to machines and instruments is facilitated.

Also in the above-described features of this invention, it is preferable that the optical active device is a light emitting device, the optical active device is a photodetecting device, and the optical active device is an optical electric integrated circuit.

By applying this invention to light emitting devices, photodetecting devices or optical electric integrated circuits, devices having high condensation and simple structure can be obtained.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 1A:
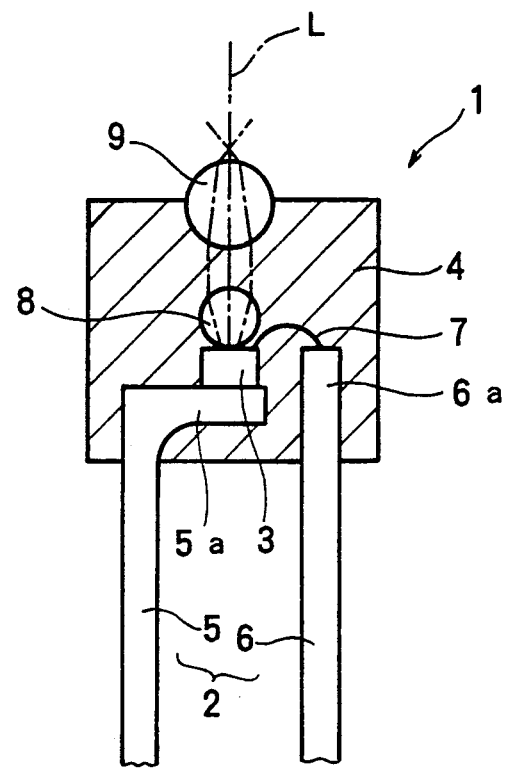
FIG. 1A is a vertical sectional view of the light emitting diode according to a first embodiment of this invention.
Figure 1B:
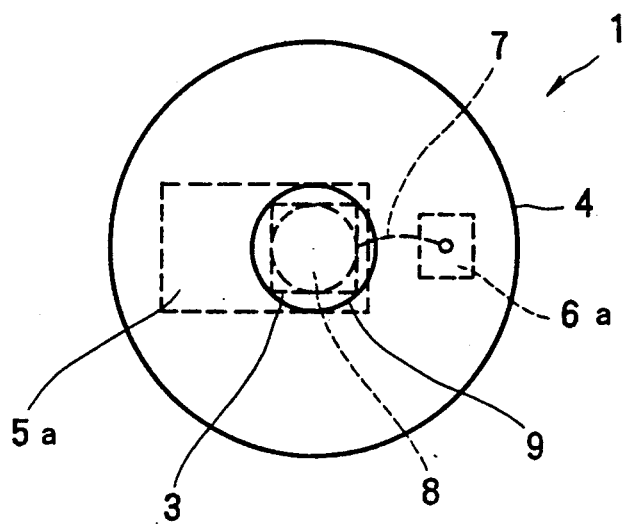
FIG. 1B is a plan view of the light emitting diode according to the first embodiment of this invention.

The light emitting diode according to a first embodiment of this invention will be explained below with reference to FIGS. 1A and 1B.

This light emitting diode 1 comprises a diode chip 3 (optical active device) mounted on a lead frame 2 which are integrated by molding a transparent resin 4 into a cylindrical shape.

The diode chip 3 is die-bonded to the bed portion 5a of a cathode lead 5 and wire-bonded to an anode lead 5 by a wire 7 bridged between the forward end of the anode lead 6 and the same. A first ball lens 8 is positioned so as to have an optical axis which coincides with an optical axis L of an emitting light of the diode chip 3 and adhered to the light emitting surface (active surface) 3a. The first ball lens 8 is buried in the transparent resin molding 4. Diffuse-radiation from the light emitting surface 3a is immediately received by the first ball lens 8 to be collimated into substantially parallel rays.

A second ball lens 9 is buried ahead of the first ball lens 8 so as to have an optical axis which coincides with the optical axis L. The radiation which has been collimated into substantially parallel rays is further converged by the second ball lens 9 to focus immediately ahead of the second ball lens 9. This fully enhances the condensation. A lower half of the second ball lens 9 is buried, and an upper half thereof is exposed. This exposed portion is positioned in a mold to be integrated by the resin molding.

In this embodiment, radiation from the diode chip 3 is collimated into substantially parallel rays by the first ball lens and is focussed by the second ball lens 9. The second ball lens 9 is larger than at least the first ball lens 8. The sizes of both lenses 8, 9 are determined by a size of the diode chip 3, a focal point, etc. The materials of both lenses 8, 9 are preferably transparent materials, especially preferably glass ball lenses, having refractive indexes equal to or higher than 1.7 to 1.9 because the refractive index of the resin molding is 1.5. In this embodiment, taking cost aspect into consideration, $TiO_2$, $BaO_2$, $SiO_2$ based glass ball lenses are suitably used. The refractive indexes of both lenses 8, 9 as well as the sizes thereof can be freely chosen to some extent.

Thus, the radiation is condensed on the two stages respectively by the first and the second ball lenses, and resultantly the light emitting diode 1 can have very high condensation. Consequently it is possible to couple the light emitting diode 1 to optical fibers of small core diameters, etc. with high coupling efficiency. The first ball lens 8 is positioned by the adhesion to the diode chip 3, and the second ball lens 9 is positioned by a mold, whereby the optical axis L can be aligned with high precision. In this embodiment, the diode chip 3 is not packaged by air-tight sealing but by molding the resin. Consequently its fabrication is easy, and the variability of the products can be decreased. In addition, the shape of the light emitting diode 1 can be freely changed in accordance with devices for the light emitting diode to be used, portions of machines and instruments for the diode to be attached to, etc.

In this embodiment, two ball lenses are used, but three or more ball lenses may be used.

Figure 2:
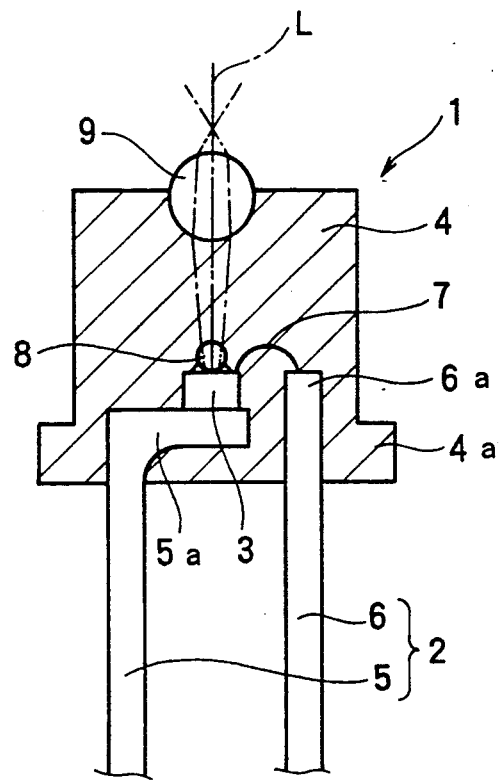
FIG. 2 is a vertical sectional view of the light emitting diode according to a modification of the first embodiment.

FIG. 2 is the light emitting diode according to one modification of the first embodiment. This modification takes the advantage of the fact that the light emitting diode can be resin-molded into a suitable shape, and the light emitting diode according to this modification has a flange 4a formed on the base of the resin molding 4 for facilitating the attachment of the light emitting diode to machines and instruments. The first ball lens 8 is relatively smaller, and the second ball lens is larger. Screw holes or the like are formed in the flange 4a for setting the light emitting diode to machines and instruments.

Figure 3:
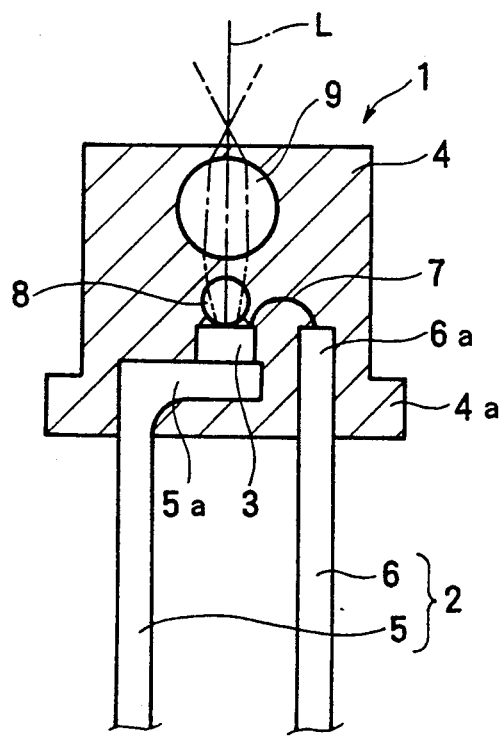
FIG. 3 is a vertical sectional view of the light emitting diode according to a second embodiment of this invention.

FIG. 3 shows the light emitting diode according to a second embodiment of this invention. In this light emitting diode 1, a flange 4a is formed as is done in the above-described modification, and a second ball lens 9 is completely buried in a molded resin for the perfect protection of the second ball lens 9 from the outside environments.

Figure 4:
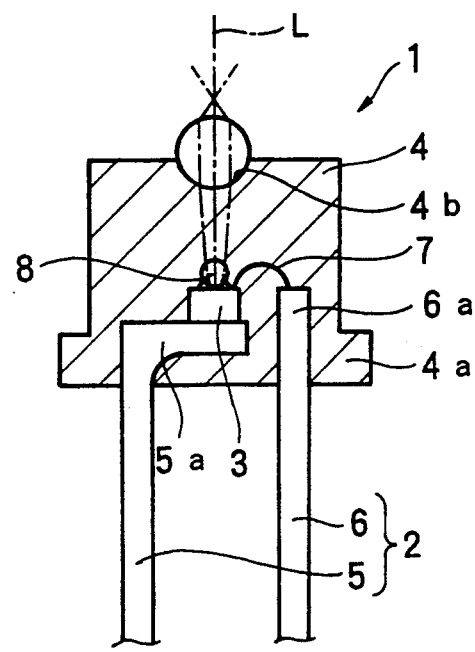
FIG. 4 is a vertical sectional view of the light emitting diode according to a third embodiment of this invention.

FIG. 4 shows the light emitting diode according to a third embodiment of this invention. In this light emitting diode 1, a concave groove 4b for the adhesion of a second ball lens 9 is formed in the emission surface of a resin molding 4. The substantially lower half of the second ball lens 9 is adhered to the concave groove 4b. This not only facilitates the fabrication of the light emitting diode, but also makes it possible to prepare a plurality of ball lenses having the same size but different refractive indexes and replace the second ball lens 9 for later arbitrary adjustment of the focal point, etc.

Figure 5:
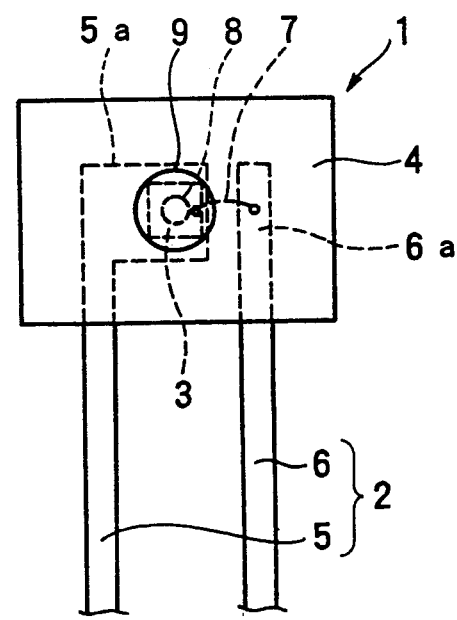
FIG. 5 is a plan view of the horizontal type light emitting diode according to a fourth embodiment of this invention.

FIG. 5 shows the light emitting diode according to a fifth embodiment of this invention. This light emitting diode 1 is the so-called horizontal type and is used in machines and instruments whose thickness is limited. A cathode lead 5 and an anode lead 6 are extended in the direction perpendicular to the optical axis L of a diode chip 3, i.e., horizontally, and this light emitting diode can be disposed in relatively narrow positions.

In the above-described embodiments and modification, the lenses are glass ball lenses, but their shapes and materials are not limited to the glass ball lenses. Resin convex lenses or the like may be used. For UV radiation, semiconductor lenses, as of InP, GaAs or others, may be used.

Figure 6A:
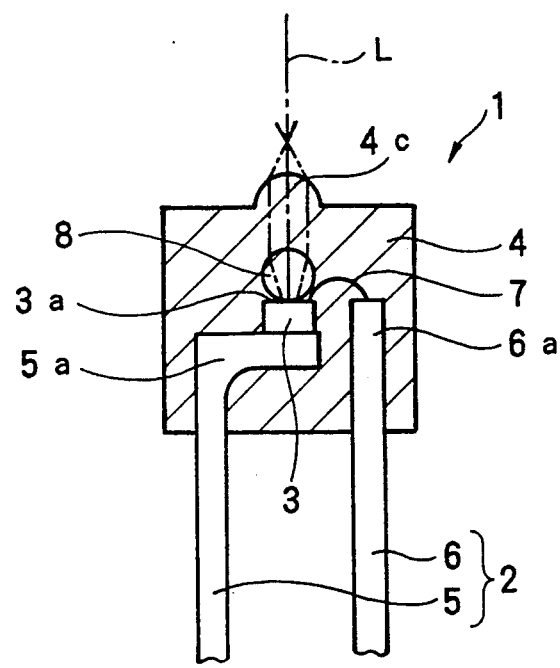
FIG. 6A is a vertical sectional view of the light emitting diode according to a fifth embodiment of this invention.
Figure 6B:
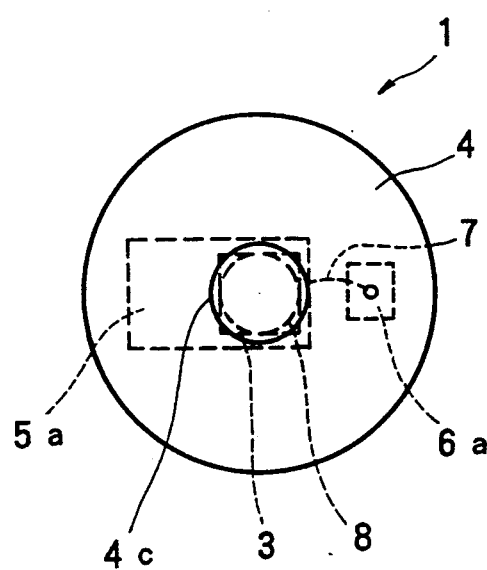
FIG. 6B is a plan view of the light emitting diode according to a fifth embodiment of this invention.

FIGS. 6A and 6B show the light emitting diode according to a fifth embodiment of the optical device of this invention.

This light emitting diode 1 has the same structure as those involved in the first to the fourth embodiments but has the following characteristics. That is, the second ball lenses 9 in the first to the fourth embodiments are replaced by a convex portion which functions as a lens and is formed ahead of a ball lens 8 and having an optical axis which coincides with an optical axis L of an emitting light of a diode chip 3, and at which radiation from the light emitting diode 3 exits. This convex portion 4c is equivalent to a semi-spherical lens. Radiation collimated into substantially parallel rays by the ball lens 8 and further condensed by the convex portion 4c so as to focus immediately ahead of the convex portion 4c. Thus the condensation is sufficiently enhanced.

In this embodiment, radiation from the diode chip 3 is converted by the ball lens 8 into substantially parallel rays and focussed by the convex portion 4c. To this end the convex portion 4c has a larger diameter than at least the ball lens 8. Both diameters are determined by a size of the diode chip 3, a focal point of the exit light, etc.

In this way, the radiation is condensed on two stages by the ball lens 8 and the convex portion 4c equivalent to a lens. Consequently the light emitting diode 1 can have very high condensation. Accordingly this light emitting diode can be coupled to small-diameter optical fibers with high coupling efficiency. The ball lens 8 is positioned by the adhesion to the diode chip 3, and the convex portion 4c is positioned by a mold. Accordingly the optical axis L can be aligned with high precision.

Figure 7:
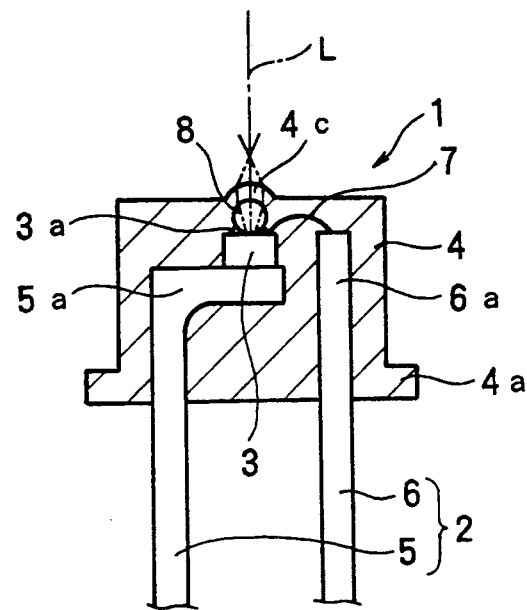
FIG. 7 is a vertical sectional view of the light emitting diode according to a modification of the fifth embodiment.

FIG. 7 shows the light emitting diode according to one modification of the embodiment of FIG. 5. This light emitting diode 1 takes the advantage of the fact that the diode 1 can be resin-molded in any contour and has a flange 4a formed on the base of the resin molding 4 for facilitating the attachment of the light emitting diode to machines and instruments. The ball lens 8 is a relatively small one, and the convex portion 4c is formed very near the ball lens 8. This arrangement can compact the light emitting diode 1 having high concentration.

Figure 8:
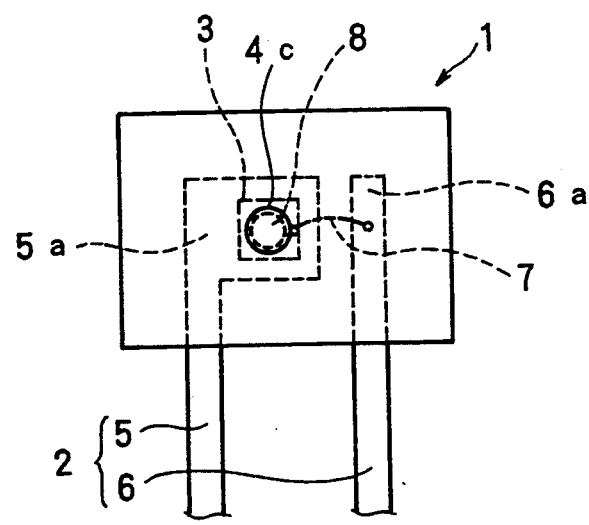
FIG. 8 is a plan view of the horizontal type light emitting diode according to a sixth embodiment of this invention.
Figure 9A:
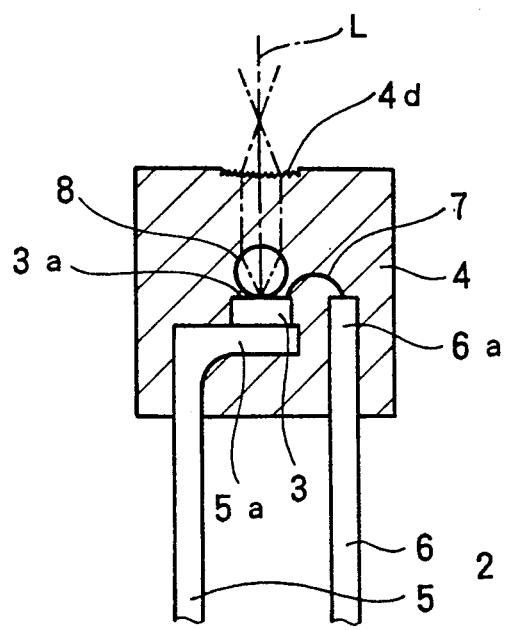
FIG. 9A is a vertical sectional view of a seventh embodiment of this invention.
Figure 9B:
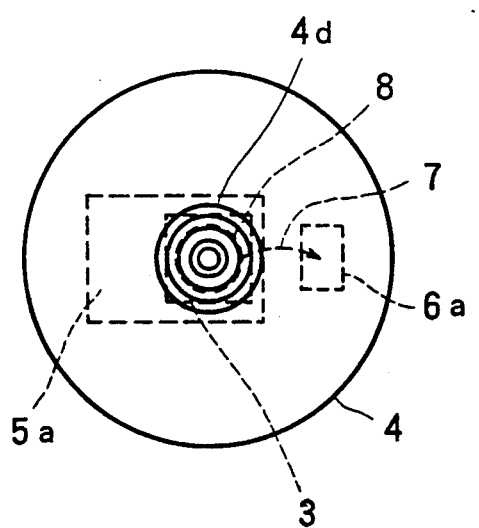
FIG. 9B is a plan view of the light emitting diode according to the seventh embodiment.

FIG. 8 shows the light emitting diode according to a sixth embodiment of this invention. This light emitting diode 1 is the so-called horizontal type and is used in machines and instruments whose thickness must be small. A cathode lead 5 and an anode lead 6 are extended in the direction perpendicular to the optical axis L, i.e., horizontally, which allows this light emitting diode to be installed in narrow spaces.

FIGS. 7A and 7B show the light emitting diode according to a seventh embodiment of this invention. In this light emitting diode 1, a ball lens 8 is adhered to a light emitting surface 3a of a diode chip 3 as in the sixth embodiment. In place of the convex portion 4c formed in a semi-sphere in the resin molding 4, a stepped surface 4d as a Fresnel lens is formed. Accordingly the exit portion of the resin molding 4 is not jutted therefrom and functions as a lens.

Figure 10:
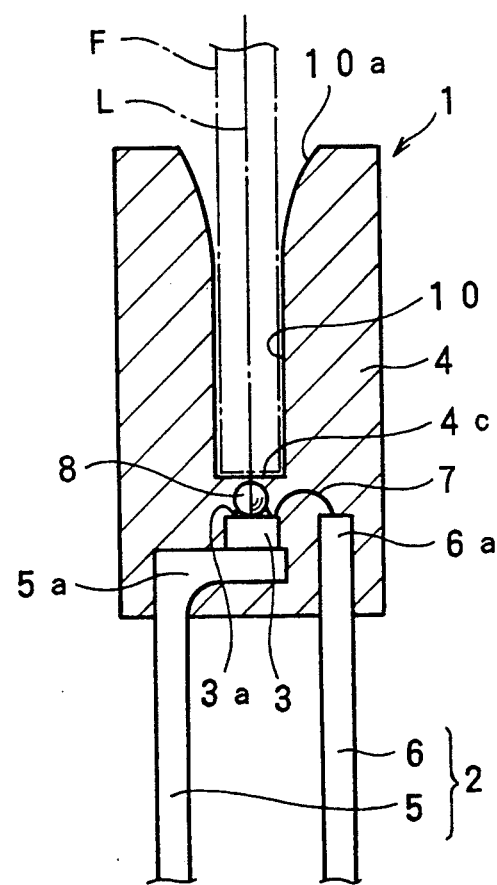
FIG. 10 is a vertical sectional view of the light emitting diode according to an eighth embodiment of this invention.

FIG. 10 shows a light emitting diode according to an eighth embodiment of this invention. This light emitting diode 1 has a unique structure which will be explained below.

A fixation groove 10 for the forward end of an optical fiber P to be inserted in is formed in an exit portion of a resin molding 4 having an optical axis which coincides with an optical axis of an emitting light of the diode chip 3. The forward end of the optical fiber F is fixed in the groove 10 by adhesion. The groove 10 is extended with the bottom thereof positioned short of the forward end of a ball lens 8 to locate the forward end of the optical fiber and the ball lens adjacent to each other as much as possible so that the light which has passed the ball lens 8 is received by the optical fiber little loss. Coupled with the condensation by the ball lens 8, this improves the coupling efficiency of the light emitting diode 1 to the optical fiber F. The entrance 10a of the fixation groove 10 is beveled in a funnel-shape for facilitating the insertion of the optical fiber F.

Thus, the light emitting diode 1 and the fixation groove 10 for the optical fiber F are moded integrate, which facilitates the fabrication of the diode and decreases the variability of the product. In addition, the alignment of an optical axis of an emitting light of the diode chip 3 with the optical axis L of the optical fiber F is automated, which facilitates the coupling of the optical fiber F and improves its coupling efficiency, and the fabrication cost is accordingly decreased. This light emitting diode is useful especially to sensors and optical communication using large-bore fibers, such as plastic fibers or others.

Figure 11:
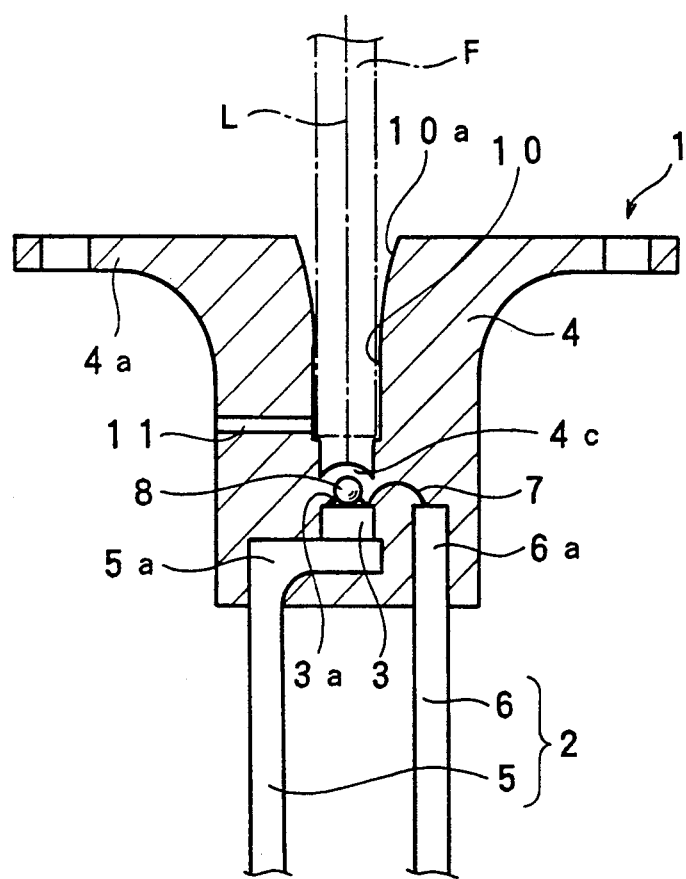
FIG. 11 is a vertical sectional view of the light emitting diode according to a modification of the eight embodiment.

FIG. 11 shows the light emitting diode according to one modification of the eighth embodiment. In this light emitting diode 1, a convex portion 4c functioning as a lens is formed at an exit 4c ahead of the ball lens 8 so that radiation from the diode chip 3 is condensed on two stages respectively by the ball lens 8 and the convex portion 4c.

In addition, taking the advantage of the fact that the diode 1 can be resin-molded into an arbitrary shape, a flange 4a with screw holes is formed on the resin molding 4 on the side of the exit for easy attachment of the light emitting diode to machines and instruments. A small hole 11 which is in communication with the fixation groove 10 is formed in the side of the molded resin 4 for the communication with the fixation groove 10, and when the optical fiber F is fixed in the groove by adhesion, an adhesive is injected through the small hole 10.

This arrangement produces high condensation and improves coupling efficiency of the optical fiber F. In addition, owing to this arrangement, the light emitting diode can be incorporated in optical communication modules, etc.

In these embodiments and modifications, the lenses are ball glasses, but shapes and materials are not limited to the glass ball lenses. Resin convex lenses or others may be used. The convex portion 4c is not necessarily convex and may be a Fresnel lens as long as the portion has the condensing function.

Figure 12A:
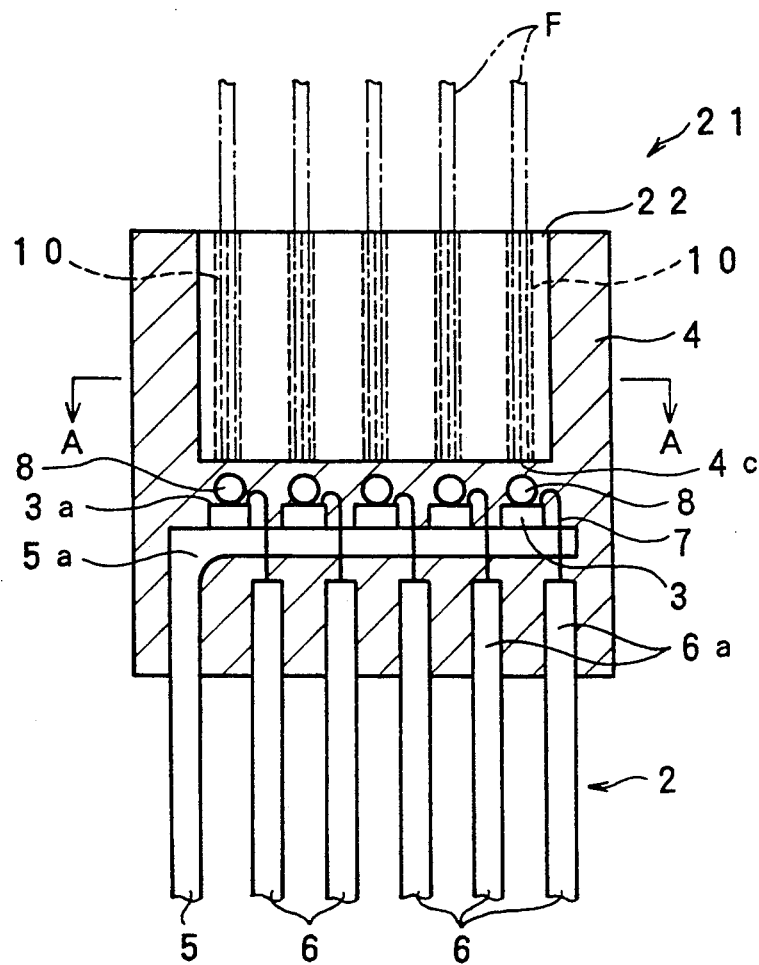
FIG. 12A is a vertical sectional view of a light emitting diode array according to a ninth embodiment of this invention.
Figure 12B:
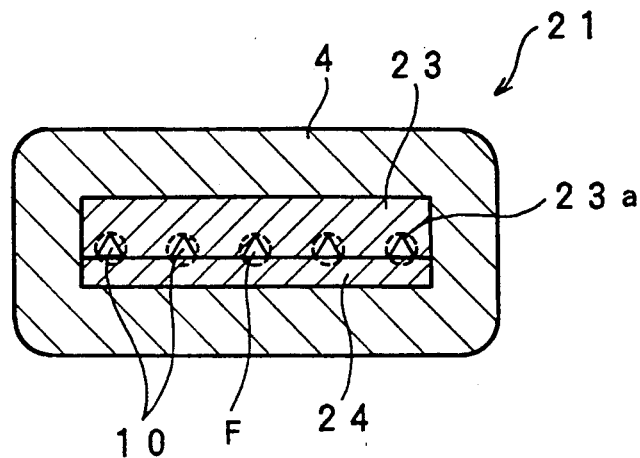
FIG. 12B is a sectional view along the line A—A in FIG. 12A.

FIG. 12 is a light emitting diode array according to a ninth embodiment of this invention.

This light emitting diode array 21 comprises a plurality (5) of diode chips mounted on a lead frame 2 and molded integral of a transparent resin 4. A ball lens 8 is adhered to the light emitting surface 3a of each of the diode chips 3 so as to have an optical axis which coincides with an optical axis of an emitting light of the diode chip, and the thus-adhered ball lenses 8 are buried in a resin molding 4.

In the resin molding 4 on the side of exits there is embedded a groove forming chip 22 having a plurality of fixation grooves 10 corresponding to the diode chips 3. The groove forming chip 22 is made of a semiconductor and comprises a Si substrate 23 having V-shaped grooves 23a formed therein, and a plate 24 adhered to the substrate so as to close the V-shaped grooves 23a. Accordingly the fixation grooves 10 have regular triangular section and the centers of the respective fixation grooves are in alignment with the optical axes of emitting lights of their associated diode chips 3.

Thus, when an optical fiber F is inserted into each of the fixation grooves 10, the optical fiber F of circular section is contact-supported at three points in the fixation groove of regular triangular section, which makes it possible to align their optical axes accurately. In addition, the precision of positioning each optical fiber with respect to adjacent one can be improved.

Figure 13:
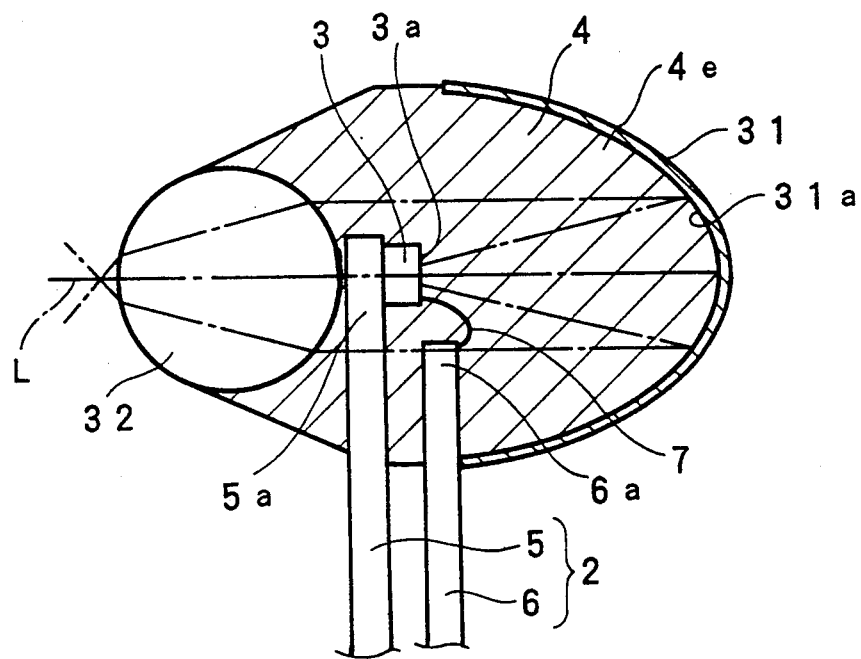
FIG. 13 is a vertical sectional view of the light emitting diode according to a tenth embodiment of this invention.

FIG. 13 shows the light emitting diode according to a tenth embodiment of this invention.

A diode chip 3 is buried substantially at the center of a resin molding 4. The direction of the light emitting surface 3a, i.e., the optical axis L, is perpendicular to a top surface of a lead frame 2.

The portion of the resin molding 4 on the side of the light emitting surface 3a is a convex portion 4e which functions as a lens along that of an emitting light from light emitting surface 3a. On the convex portion 4e there is formed a reflection layer 31 for reflecting radiation from the light emitting surface 3a. The reflection layer 31 has a parabolic reflection surface 31a which constitutes a concave mirror for reflecting the radiation into parallel rays. The reflection layer 31 is formed by vaporizing a metal, e.g., aluminum (A1), Ag (silver) or others or plating a metal, e.g., A1, Ag or others. Consequently the reflection surface 31a can be formed very easy and have very good reflection.

By this arrangement, diffused radiation from the light emitting surface 3a of the diode chip 3 is reflected against the reflection surface 31a of the reflection layer 31 to be converged into parallel rays.

A ball lens 32 is buried on the same optical axis as that of the diode chip 3 in a portion of the molded resin 4 on the side of an exit opposite to the convex portion 4e across the diode chip 3. The radiation which has been condensed into substantially parallel rays by the reflection layer 31 is further condensed by the ball lens 32 so as to focus immediately before the ball lens 32. Thus the condensation can be sufficiently enhanced. The rear half of the ball lens 32 is buried in the resin molding 4, and the forward half thereof is exposed, and the exposed half is positioned in a mold to be resin-molded. But the ball lens 32 is not necessarily buried in the molded resin 4, but instead a concave groove may be formed in that portion of the resin molding 4 for the adhesion of the ball lens 32 thereto.

In this embodiment, radiation (diffusion light) from the diode chip 3 is converted into parallel rays by the reflection layer 31 and is further converged to focus, and accordingly the ball lens 32 may be large, taking into consideration a focal point, of the emitting light. The material of the ball lens 32 is a transparent material having a refractive index of 1.7 to 1.9 in view of the refractive index of the resin molding of 1.5, and especially preferable is a glass ball lens. In this embodiment, taking the cost aspect into consideration, $TiO_2$, $BaO_2$ or $SiO_2$ based glass ball lens is used, and its refractive index as well as its size can be arbitrarily chosen.

The radiation is converged on two stages by the concave mirror provided by the reflection layer 31, and the ball lens 32, and resultantly the light emitting diode 1 has very high condensation. Consequently, even in coupling with glass fibers of small cores, high coupling efficiency can be obtained.

In this embodiment, the ball lens is one, but two or more ball lens may be used. The ball lens may not be used in the case high condensation is not necessary.

Figure 14:
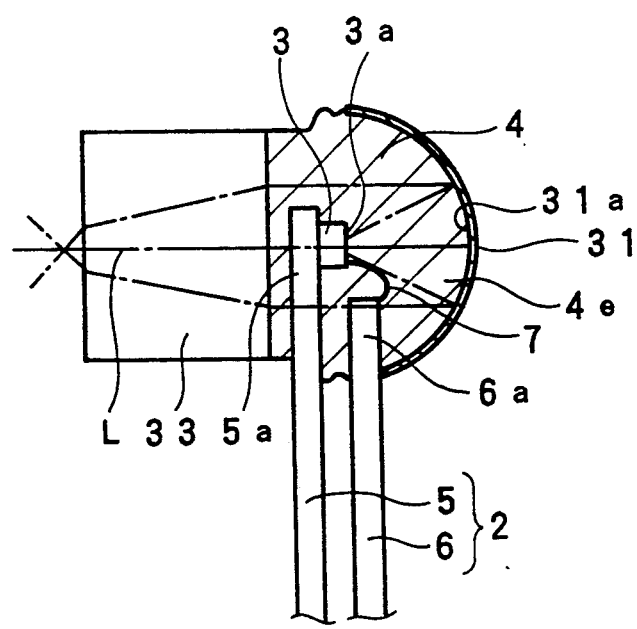
FIG. 14 is a vertical sectional view of the light emitting diode according to an eleventh embodiment of this invention.

FIG. 14 shows the light emitting diode according to an eleventh embodiment of this invention. In this light emitting diode 1, a convex portion 4e of a resin molding 4 is formed in a semi-spherical surface, and a reflection layer 31 is formed on this semi-spherical surface. The ball lens 32 is replaced by a rod lens 33. In this case as well, radiation from a light emitting surface 3a can be converted into substantially parallel rays, and the rod lens 33 enhances the condensation.

Figure 15:
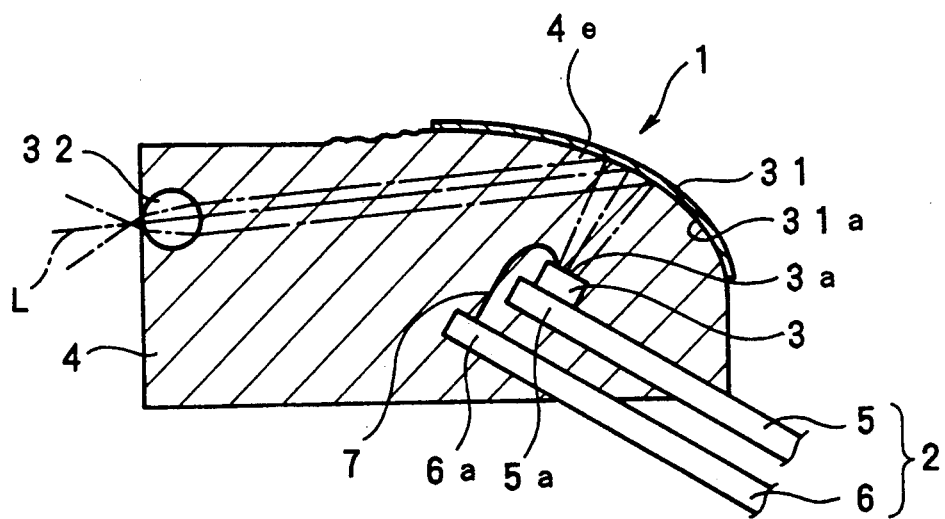
FIG. 15 is a vertical sectional view of the light emitting diode according to a twelfth embodiment of this invention.

FIG. 15 is the light emitting diode according to a twelfth embodiment of this invention. In this light emitting diode 1, a convex portion 4e of a resin molding 4 is formed by a part of a parabolic surface, and a reflection layer 31 is formed on the part. The molding is conducted so that a diode chip 3 is near the reflection layer 31 as much as possible, so that radiation is reflected while its diffusion width is still small to be converged into parallel rays. A ball lens 32 is relatively small and is completely buried in a resin molding 4.

In these embodiments, the concave mirrors provided by the reflection layers 31 are parabolic mirrors and semi-spherical mirrors, but they are not limited to them. The concave mirrors may be equivalent to lenses, which can reflect and converge radiation, e.g., hyperboloid mirrors, ellipsoid mirrors or Fresnel lens-shaped reflection mirrors.

Figure 16:
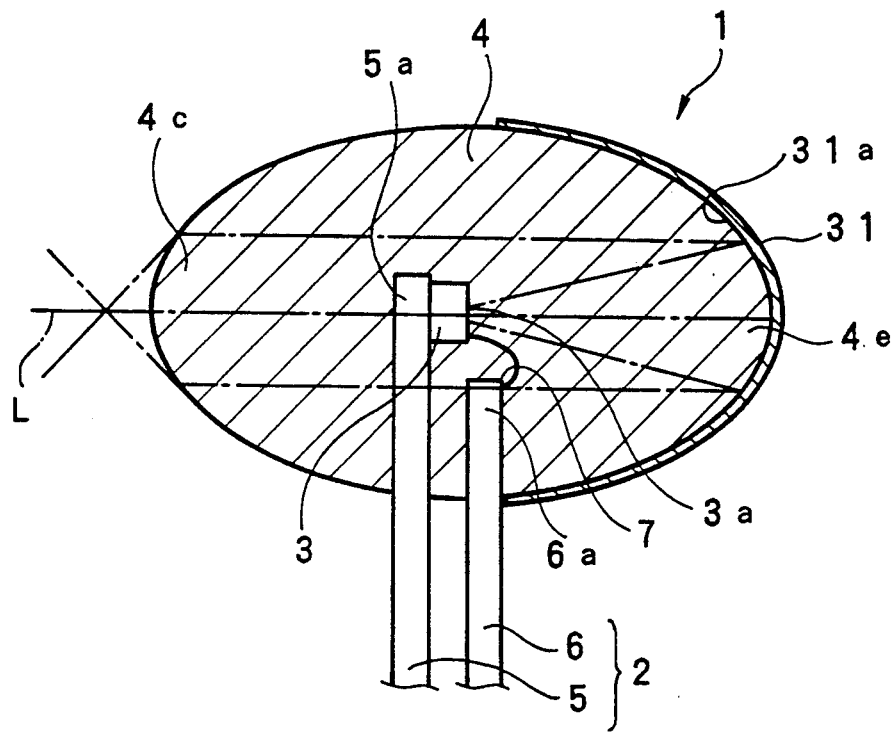
FIG. 16 is a vertical sectional view of the light emitting diode according to a thirteenth embodiment of this invention.
Figure 17:
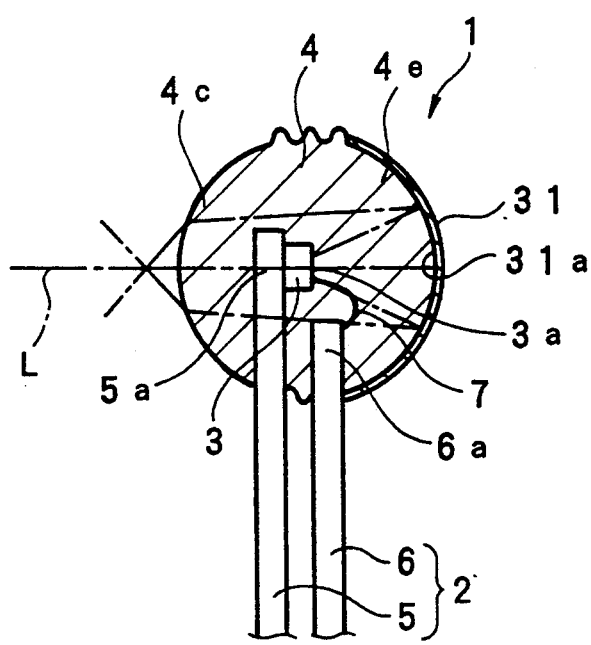
FIG. 17 is a vertical sectional view of the light emitting diode according to a fourteenth embodiment of this invention.

FIG. 16 shows the light emitting diode according to a thirteenth embodiment of this invention.

The portion of a resin molding 4 facing to a light emitting surface 3a provides a first convex portion 4e which functions as a lens along the same optical axis L as that of the light emitting surface 3a. On the first convex portion 4e there is formed a reflection layer 31 against which radiation from the light emitting surface 3a is reflected. The reflection layer 31 has the reflection face 31a formed in a parabolic surface for reflecting the radiation into parallel rays.

On an exit there is formed a second convex portion 4c which functions as a lens so that the parallel rays reflected against the reflection layer 31 are further converged to exit. The surface of the second convex portion 4c is made parabolic as is the first convex portion 4e so that the former can satisfactorily function as a lens. The radiation which has been substantially converged into substantially parallel rays is further converged by the second convex portion 4c to focus immediately before the second convex portion 4c.

Thus, the radiation is condensed on two stages by the concave mirror constituted by the first convex portion 4e and the reflection layer 31, and the lens constituted by the second convex portion 4c. Consequently the light emitting diode 1 has very high condensation, and high coupling efficiency can be obtained in coupling with optical fibers having small core diameters.

Figure 18:
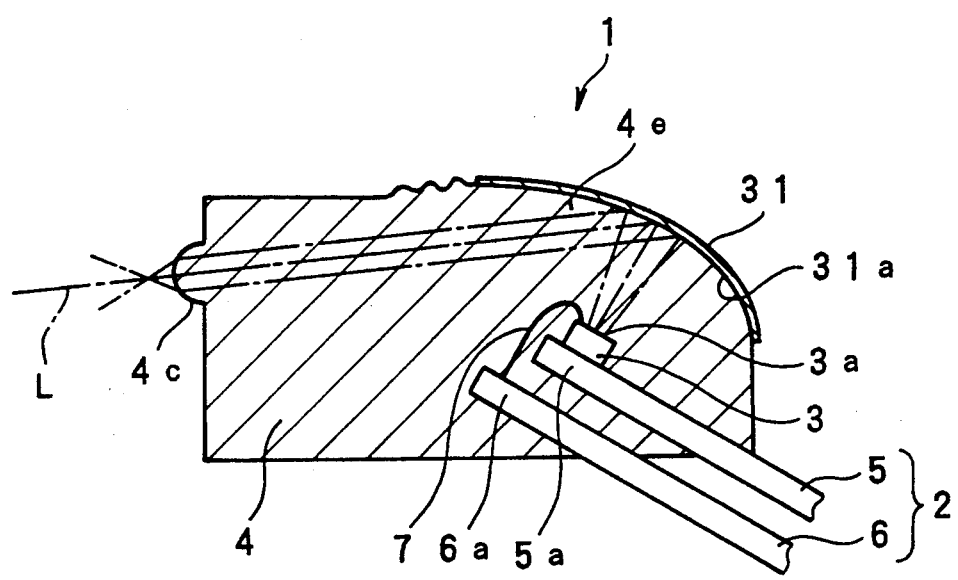
FIG. 18 is a vertical sectional view of the light emitting diode according to a fifteenth embodiment of this invention.

FIG. 18 shows the light emitting diode according to a fifteenth embodiment. In this light emitting diode 1, a first convex portion 4e of a molded resin 4 is provided by a part of a parabolic surface, and on this is formed a reflection layer 31. The molding is conducted so that the diode chip 3 is near the reflection layer 31 as much as possible. Consequently the radiation is reflected into parallel rays while the diffuse width of the radiation is still small. The second convex portion 4c is formed in a semi-sphere and relatively small.

Figure 19:
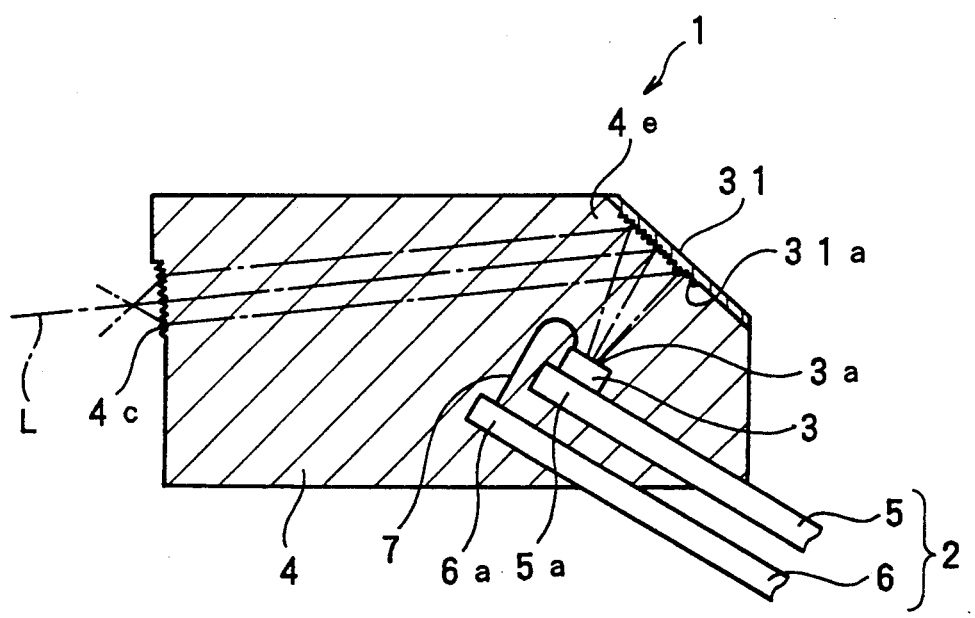
FIG. 19 is a vertical sectional view of the light emitting diode according to a sixteenth embodiment of this invention.

FIG. 19 is the light emitting diode according to a sixteenth embodiment. In this light emitting diode 1, a first convex portion 4e of a molded resin 4 has a stepped face as a Fresnel lens. A reflection layer 41 is formed on the first convex portion 4e to form a Fresnel mirror.

Consequently the first and the second convex portions 4e, 4c can satisfactorily function as lenses without jutting the first and the second convex portions 4e, 4c, and resultantly the light emitting diode 1 can be compact.

Figure 20:
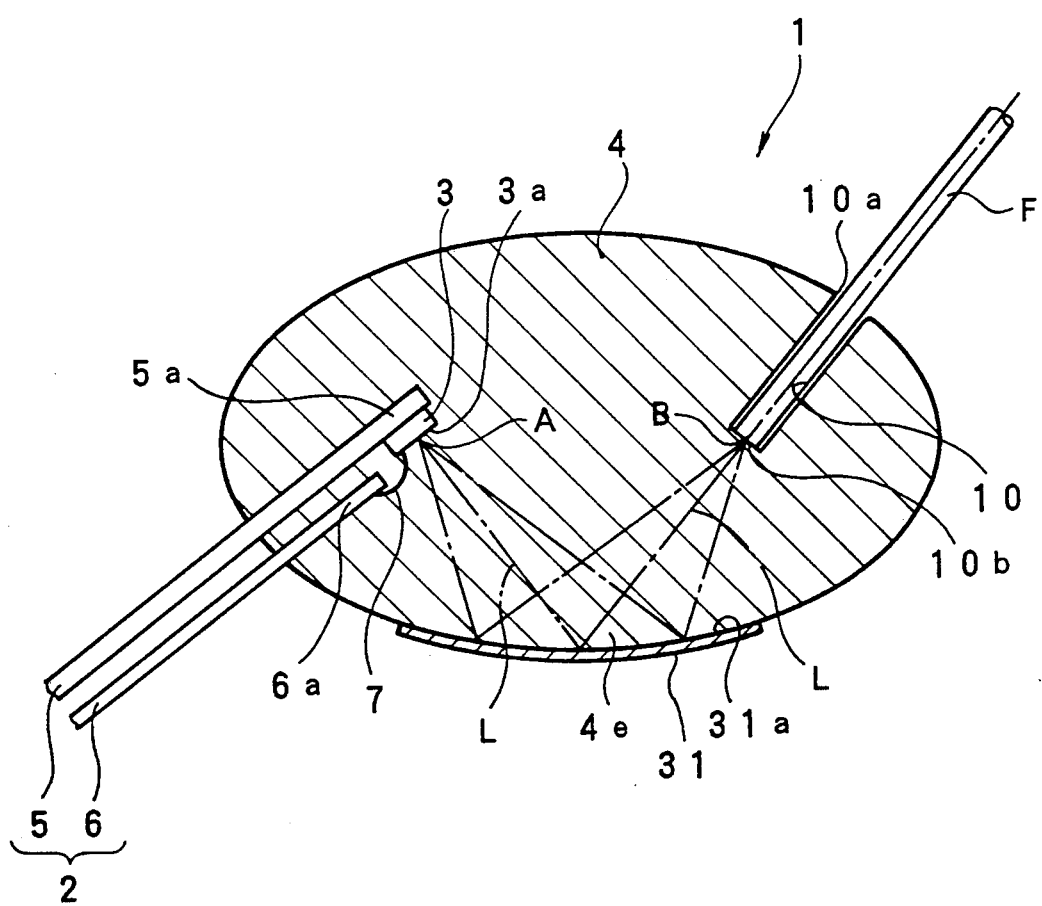
FIG. 20 is a vertical sectional view of the light emitting diode according to a seventeenth embodiment of this invention.

With reference to FIG. 20, the light emitting diode involved in the optical device according to this invention will be explained.

In the light emitting diode 1, a light emitting diode chip 3 is buried in resin molding 4 so that the center of the light emitting surface 3a thereof is in agreement with a first focus A (one focal point) of an elliptical ball, and the direction of the light emitting surface 3a, i.e., the direction of the optical axis L, is perpendicular to a frame 2.

An inner surface of the resin molding the light emitting surface 3a of the light emitting diode chip 3 is a required convex portion 4e, i.e., a portion of an elliptical ball having a larger curvature radius, and a reflection layer 31 is formed on the convex portion 4e for reflecting radiation from the light emitting surface 3a, whereby a concave mirror is constituted. Because this reflection layer 31, which is formed on the surface of the convex portion 4e, has the reflection surface 31a formed in an elliptical ball surface, all the diffuse radiation from the light emitting diode chip 3, which has been reflected against the reflection surface 31a, is condensed at a second focal point B (the other focal point) in the resin molding 4.

At the second focal point B in the resin molding 4 there is formed a fixation groove 10 for the forward end of an optical fiber F to be fixedly inserted in is formed so as to have an optical axis which coincides with an emitting light of the light emitting diode chip 3 (actually on the optical axis of the reflected radiation). The center of the groove bottom 10b of the fixation groove 9, i.e., the core portion, which is the center of the end surface of the optical fiber F confronting the groove bottom 10b, coincides with the second focal point B. Resultantly, the diffuse radiation from the light emitting surface 3a of the light emitting diode chip 3 is reflected against the reflection surface 31a of the reflection surface 31 and condensed to focus at the center of the bottom 10b of the fixation groove 10. That is, the forward end of the optical fiber F is inserted fixedly in the fixation groove 10 with the core of the inserted optical fiber F at the end surface positioned at the second focal point B and with the optical axes L of the light emitting diode chip 3 and of the optical fiber F aligned with each other. Consequently all the radiation from the light emitting diode chip 3 is condensed to be incident on the optical fiber F, with the result that the coupling efficiency between the light emitting diode 1 and the optical fiber F is enhanced. The entrance 10a of the fixation groove 10 is beveled in a funnel-shape for facilitating the insertion of the optical fiber F. The optical fiber F inserted in the fixation groove 10 is fixed by an adhesive.

Thus, the convex portion 4e provided by a part of an elliptical ball, and the reflection layer 31 condense the radiation from the light emitting diode chip 3 without loss, whereby the light emitting diode 1 can have high condensation, and accordingly the high coupling efficiency can be obtained in even coupling with optical fibers of small core diameters. In addition, the light emitting diode 1, and the fixation groove 10 for the optical fiber F to be coupled are molded in one-piece, whereby the optical axes L of the an emitting light of light emitting diode chip 3 and of the optical fiber F can be automatically aligned, with results that the optical fiber can be easily coupled, and its coupling efficiency is enhanced. Accordingly, the fabrication cost is decreased. This light emitting diode is especially useful in sensors and optical communication using large-bore fibers, such as plastic fibers, etc.

Figure 21:
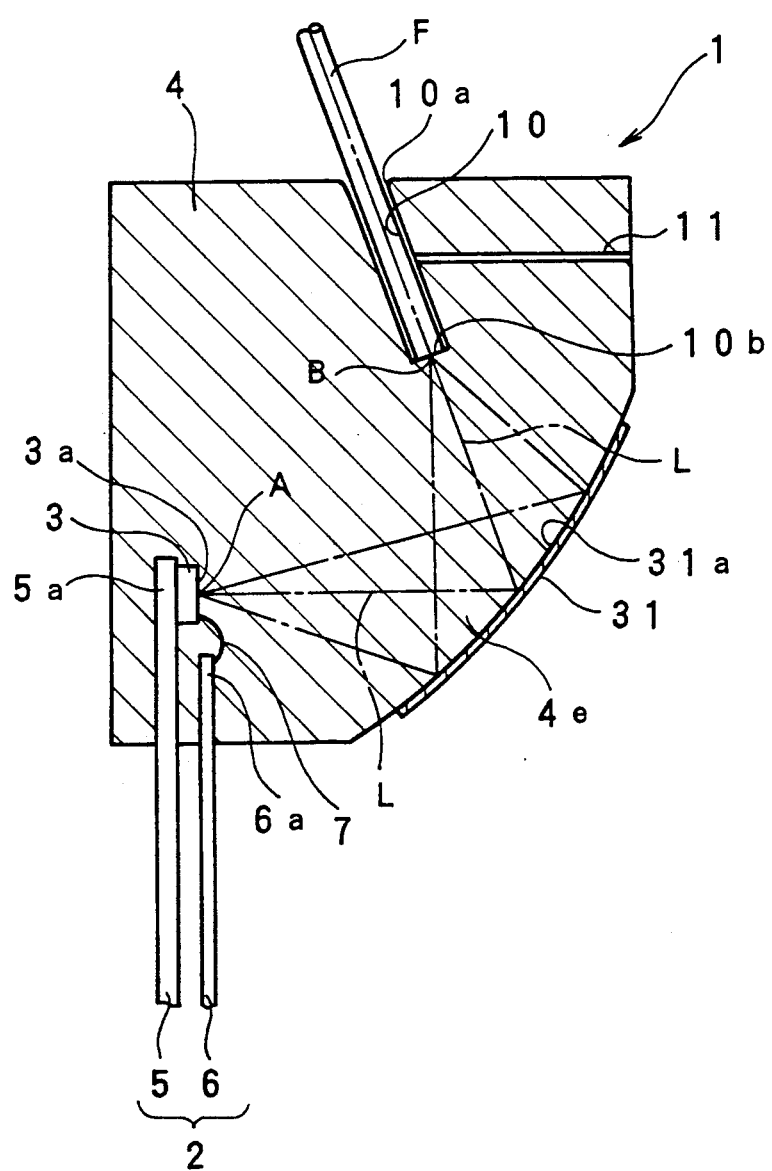
FIG. 21 is a vertical sectional view of the light emitting diode according to a modification of the seventeenth embodiment.

FIG. 21 is a sectional side view of the light emitting diode according to one modification of the seventeenth embodiment. This light emitting diode 1 is not molded integral in a one-piece elliptical ball but integral with only a required convex portion 4e formed in a part of an empirical ball. That is, the center of a light emitting surface 3a of a light emitting diode chip 3, and that of the groove bottom 10a of a fixation groove 10 are a first focal point A and a second focal point B. The radiation from the light emitting surface 3a is the elliptical surface and the reflection layer 31. This embodiment takes the advantage of the fact that the light emitting diode 1 can be resin-molded in an arbitrary shape 4. Depending on cases, flanges or others for the attachment to machines and instruments may be formed in one-piece. In the molded resin 4 there is formed a small hole 11 communicating with the fixation groove 10ng through the side of the molded resin 4, and in adhering the optical fiber F, an adhesive may be fed through this small hole 11.

This arrangement makes it possible that the light emitting diode 1 having enhanced coupling efficiency with the optical fiber F can be molded in suitable shapes corresponding to positions where the light emitting diode 1 is incorporated.

In the above-described embodiments, the optical device is light emitting diodes, but it is needless to say that the optical device according to this invention is applicable to light detecting devices, such as photo-diodes and others, or optical electric integrated circuits (OEIC) integrating these optical positive devices and electric devices, such as amplifiers, drivers, FETs, etc.

Figure 22:
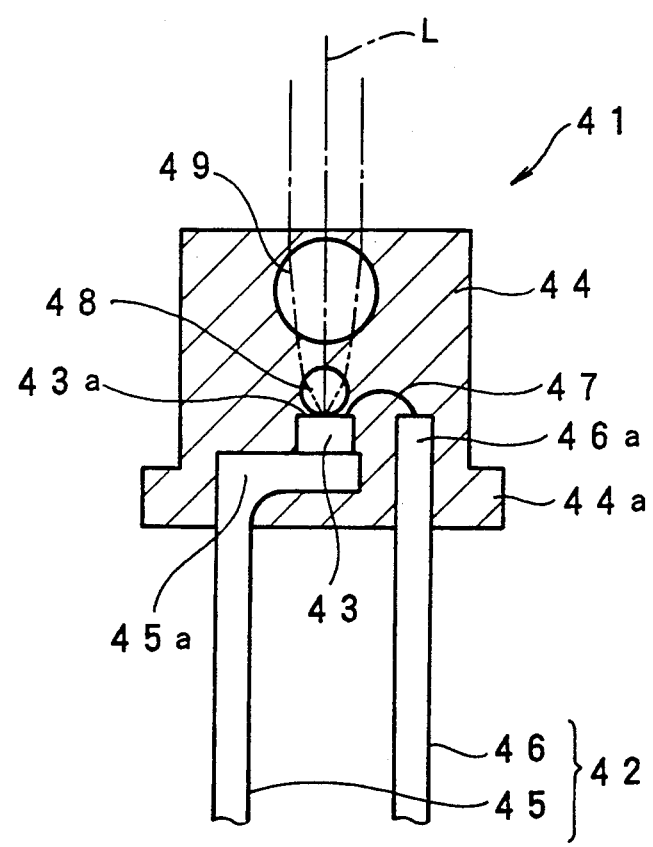
FIG. 22 is a vertical sectional view of the photodiode according to an eighteenth embodiment of this invention.

FIG. 22 shows a photo-diode involved in an eighteenth embodiment of the optical positive device according to this invention. This photo-diode 41 comprises a diode chip (optical active device) 43 mounted on a lead frame 42 which are molded of a transparent resin 4 to be integral in a cylindrical shape.

A diode chip 43 is die-bonded to the bed 45a of a cathode lead 45 and wire-bonded with the forward end 46 of an anode lead 46 by a wire 47. A first ball lens 48 is adhered to the photodetecting surface 43 (active surface) of the diode chip 43 on the same optical axis L as the diode chip 43. In this state the first ball lens 48 is buried in a resin molding 44.

In the resin molding 44 a second ball lens 49 as well is buried before the first ball lens 48 so as to have an optical axis which coincides with an optical axis L of an emitting light of the diode chip 43. Radiation entering from the outside is led from an entrance of the resin molding 44 to be condensed here, and further condensed by the first ball lens 48 to focus on the photodetecting surface 43a of the diode chip 43.

The material of both ball lenses 48, 49 in this embodiment is a transparent material having a refractive index equal to or higher than 1.7 to 1.9, taking it into consideration that the refractive index of the resin molding 44 is 1.5, and especially glass ball lenses are preferable. In this embodiment, taking cost aspect into account, TiO$_2$, BaO$_2$ and SiO$_2$ based glass ball lenses are selectively used. The refractive indexes of both lenses 48, 49 as well as their sizes can be selected freely to some extent.

Thus, the incident light can be condensed on two stages by the first ball lens 48 and the second ball lens 49, and consequently the photodiode 41 can have very high condensation efficiency.

Figure 23:
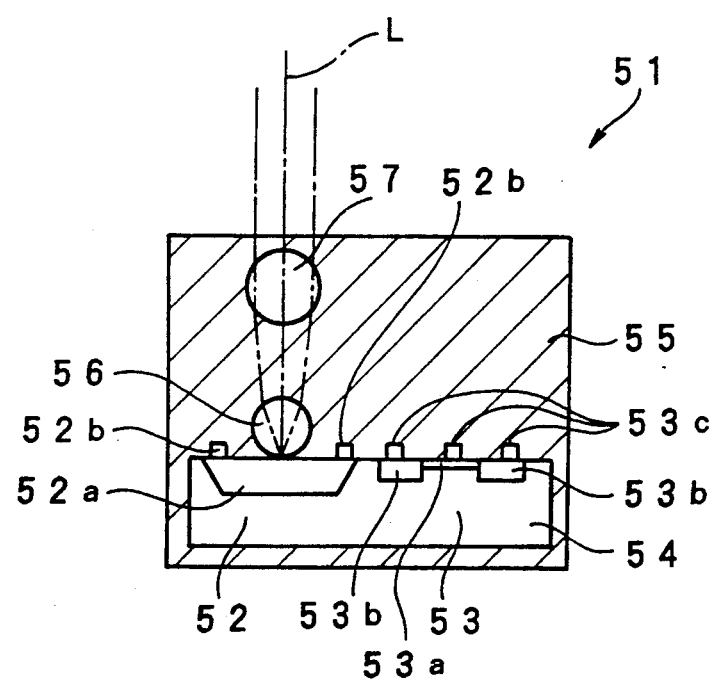
FIG. 23 is a vertical sectional view of the optical electric integrated circuit according to a nineteenth embodiment of this invention.
Figure 24A:
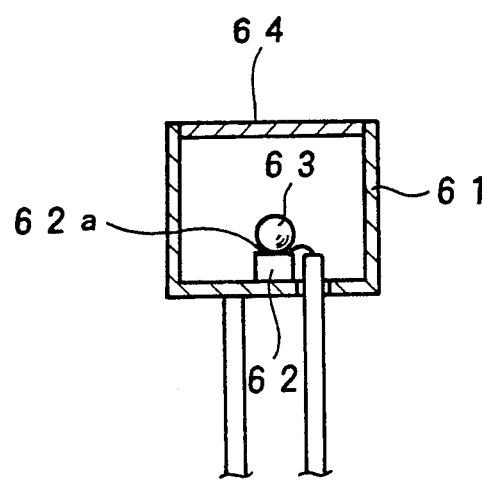
FIG. 24A is a vertical sectional view of the light emitting diode using the conventional can-type package.
Figure 24B:
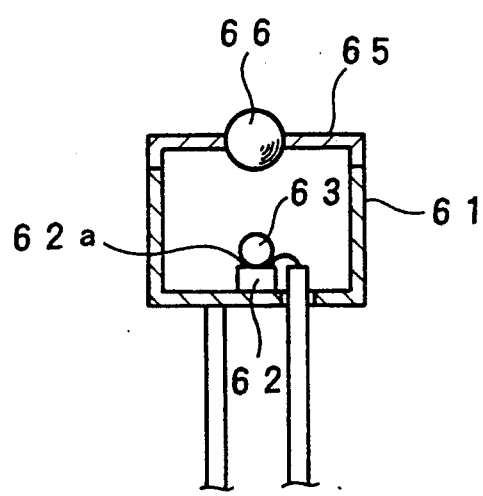
FIG. 24B is a vertical sectional view of the light emitting diode using the conventional can-tyoe package.
Figure 25:
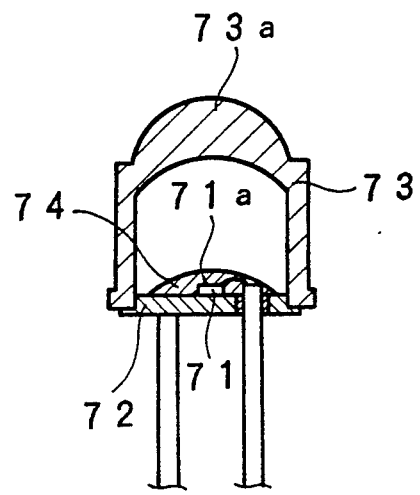
FIG. 25 is a vertical sectional view of the light emitting diode using the conventional plastic package.
Figure 26:
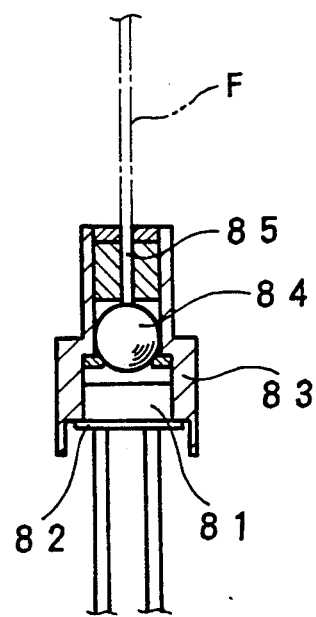
FIG. 26 is a vertical sectional view using the conventional LED collimator (light emitting device)
Figure 27:
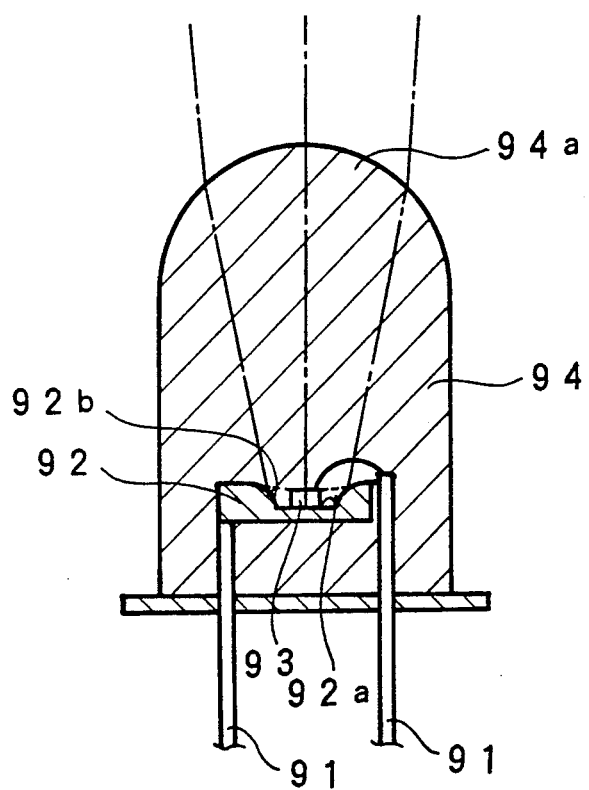
FIG. 27 is a vertical sectional view of the conventional light emitting diode having the condensation improved.

FIG. 23 shows the optical electric integrated circuit according to a nineteenth embodiment of the optical device of this invention. This optical electric integrated circuit 51 comprises a substrate 54, a photodetecting region 52 and a signal processing circuit region 53 which are integrally molded of a transparent resin.

In the photodetecting region 52, GaAs doped by Er is crystal-grown as a buried light absorption layer 52a. On the light absorption layer 52a there are formed a pair of electrodes 52b, 52b for taking out signals. In the signal processing circuit 53 there are formed a contact region 53a and active layers 52b, 53b, and electrodes 53c, 53c, 53c thereon. The electrodes 53c, 53c, 53c are a source electrode, a gate electrode and a drain electrode, and function as circuit elements for signal processing to constitute a FET.

A first ball lens 56 is adhered to the surface of the light absorption layer of the photodetecting region 52 so as to have an optical axis which coincides with an optical axis of an emission light from the light absorption layer 52. In thus adhered state the first ball lens 56 is buried in a molded resin 55.

A second ball lens 57 is also buried in the resin molding before the first ball lens 56 so as to have an optical axis which coincides with an optical axis of an emitting light from the light absorption layer. The radiation from the outside is led from the entrance of the molded resin 55 to the second ball lens 57 to be condensed here and further condensed by the first ball lens 56 to focus on the surface of the light absorption layer 52. Here the radiation is photoelectrically converted and then is processed, e.g., amplified, etc. in the signal processing circuit region 53.

Thus the incident light is condensed on two stages by the first and the second ball lenses 56, 57, and consequently the optical electric integrated circuit can have very high condensation efficiency and can be compact.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. An optical device comprising:
   a frame;
   an optical active element mounted on the frame;
   two lenses facing an active surface of the optical active element and having an optical axis which coincides with an optical axis of an incident or emitting light of the optical active element; and
   a light-transmitting resin molding for making integral the frame, the optical active element and the two lenses.

2. An optical device according to claim 1, wherein at least one of the two lenses is adhered to the active surface of the optical active element.

3. An optical device comprising:
   a frame;
   an optical active element mounted on the frame;
   two lenses facing an active surface of the optical active element and having an optical axis coinciding with an optical axis of an incident or emitting light of the optical active element; and
   a light-transmitting resin molding for making integral the optical active element, the frame and the lenses, an incidence or emission surface of the light-transmitting resin molding is formed in convex surfaces functioning as lenses.

4. An optical device comprising:
   a frame;
   an optical active element mounted on the frame;
   first and second lenses facing an active surface of the optical active element and having an optical axis coinciding with an optical axis of an incident or emitting light of the optical active element; and
   a light-transmitting resin molding for making integral the optical active element, the frame and the first lens, the second lens is adhered to an incidence or emitting surface of the light-transmitting resin molding.

5. An optical device comprising;
   a frame;
   an optical active element mounted on the frame;
   two lenses facing an active surface of the optical active element and having an optical axis which coincides with an optical axis of an incident or emitting light of the optical active element; and
   a light-transmitting resin molding for making integral the optical element, the frame and the lenses, a fixation groove is provided in the light-transmitting resin molding facing an incidence or emission surface of the optical active element, the groove bottom is the incidence or emission surface of the light-transmitting resin molding, the lenses are provided between the active surface of the optical active element and the groove bottom, an optical axis of the groove bottom coincides with the optical axis of the lenses, when an optical fiber is fixed into the fixation groove an optical axis of the optical fiber coincides with the optical axis of the groove bottom.

6. An optical device according to claim 5, wherein the groove bottom is formed in convex surfaces 7. An optical device according to claim 5, wherein a bottom surface of the fixation groove is beveled.

8. An optical device according to claim 5, wherein the fixation groove has a regular triangle section.

9. An optical device comprising;
a frame;
an optical active element mounted on the frame;
two lenses facing an active surface of the optical active element and having an optical axis which coincides with an optical axis of an incident or emitting light of the optical active element;
a light-transmitting resin molding for making integral the optical active element, the frame and the lenses;
an Si substrate embedded in the light-transmitting resin molding, a V-shaped fixation groove is formed in the Si substrate facing an incidence or emission surface of the optical active element, the groove bottom is the incidence or emission surface of the light-transmitting resin molding, the lenses are provided between the active surface of the optical active element and the groove bottom, an optical axis of the groove bottom coincides with the optical axis of the lenses, when an optical fiber is fixed into the fixation groove an optical axis of the optical fiber coinciding with the optical axis of the groove bottom; and
a plate adhered to the Si substrate so as to close the V-shaped fixation groove.

10. An optical device comprising:
a frame;
a plurality of optical active elements mounted on the frame in alignment;
a light-transmitting resin molding for making integral the optical elements and the frame;
an Si substrate embedded in the light-transmitting resin molding, a V-shaped fixation groove is provided in the Si substrate facing an incidence or emission surface of an optical active element, the groove bottom is the incidence or emission surface of the light-transmitting resin molding, an optical axis of the groove bottom coinciding with the optical axis of an incidence or emission surface of the optical active element, when an optical fiber is fixed into the fixation groove an optical axis of the optical fiber coincides with the optical axis of the groove bottom; and
a plate adhered to the Si substrate so as to close the V-shaped groove.

11. An optical device according to claim 1, wherein the lenses are spherical lenses.

12. An optical device according to claim 11, wherein the lenses are ball lenses.

13. An optical device according to claim 1, wherein the lenses are non-spherical lenses.

14. An optical device according to claim 1, wherein refractive indexes of the lenses are higher than the refractive index of the resin molding.

15. An optical device according to claim 1, wherein the lenses are glass lenses.

16. An optical device according to claim 15, wherein the glass lenses are made of $TiO_2$ glass, $BaO_2$ glass or $SiO_2$ glass as main components.

17. An optical device according to claim 1, wherein the lenses are a light-transmitting semiconductor.

18. An optical device according to claim 17, wherein the semiconductor device comprises InP or GaAs as a main component.

19. An optical device according to claim 3, wherein a entrance and exit surface are spherical.

20. An optical device according to claim 3, wherein a entrance and exit surface are formed in stepped surfaces as Fresnel lenses.

21. An optical device comprising:
a frame;
an optical active element mounted on the frame; and
a light-transmitting resin molding for making integral the optical element and the frame, the light-transmitting resin molding having a convex surface with a stepped reflective layer that operates as a Fresnel lens, an optical axis of the Fresnel lens coinciding with an optical axis of an emission or incidence surface of the optical active element.

22. An optical device according to claim 21, wherein the convex surface constituting the reflection layer is spherical.

23. An optical device according to claim 21, wherein the convex surface forming the reflection layer is an elliptical ball surface.

24. An optical device according to claim 21, wherein the convex surface forming the reflection layer is a parabolic surface.

25. An optical device comprising:
a frame;
an optical active element mounted on the frame;
lenses facing an incidence or emission surface of the optical active element; and
a light-transmitting resin molding for making integral the optical element, the lenses and the frame, the light-transmitting resin molding having a convex surface with a stepped reflective layer that operates as a Fresnel lens facing an incidence or emission surface of the optical active element.

26. An optical device according to claim 21, wherein lenses are adhered to an incidence or emission surface of the resin molding.

27. An optical device comprising:
a frame;
an optical active element mounted on the frame; and
a light-transmitting resin molding for making integral the optical element and the frame, an incidence or emission surface of the light-transmitting resin molding is formed in a convex surface functioning as a lens, the convex surface having a reflection layer comprising a reflection mirror, the lens faces an active surface of the optical active element, and another lens is formed by a portion of the light-transmitting resin molding opposite the convex surface through the optical active element.

28. An optical device according to claim 27, wherein the incidence or emission surface is spherical.

29. An optical device according to claim 27, wherein the incidence or emission surface is elliptical ball surface.

30. An optical device according to claim 27, wherein the incidence or emission surface is parabolic.

31. An optical device according to claim 21, wherein the incidence or emission surface of the light-transmitting resin molding is formed in a convex surface operating as a lens.

32. An optical device according to claim 21, further comprising a fixation groove provided in the light-transmitting resin molding facing an incidence or emission surface of the optical active element, when an optical fiber is fixed into the fixation groove an optical axis of the optical fiber coincides with an optical axis of an incident or emitting light of the optical active element.

33. An optical device according to claim 32, wherein a substantial center of a groove bottom of the fixation groove is positioned at or near a focal point of light reflected against the reflection layer.

34. An optical device according to claim 29, further comprising a fixation groove provided in the resin molding facing an incidence or emission surface of the optical active element, when an optical fiber is fixed into the fixation groove, an optical axis of the optical fiber coincides with an optical axis of an incident or emitting light of the optical active element,
- a substantial center of the active surface of the optical active element being positioned at a first focal point of the elliptical vallm and a substantial center of a groove bottom of the fixation groove being positioned at a second focal point.

35. An optical device according to claim 1, wherein an attachment flange is formed on a part of the resin molding.

36. An optical device according to claim 1, wherein the optical active device is a light emitting device.

37. An optical device according to claim 1, wherein the optical active device is a photodetecting device.

38. An optical device according to claim 1, wherein the optical active device is an optical electric integrated circuit.

39. An optical device according to claim 4, wherein the lenses are spherical lenses.

40. An optical device according to claim 5, wherein the lenses are spherical lenses.

41. An optical device according to claim 4, wherein the lenses are non-spherical lenses.

42. An optical device according to claim 5, wherein the lenses are non-spherical lenses.

43. An optical device according to claim 4, wherein refractive indexes of the lenses are higher than the refractive index of the resin molding.

44. An optical device according to claim 5, wherein refractive indexes of the lenses are higher than the refractive index of the resin molding.

45. An optical device according to claim 4, wherein the lenses are glass lenses.

46. An optical device according to claim 5, wherein the lenses are glass lenses.

47. An optical device according to claim 4, wherein the lenses are a light-transmitting semiconductor.

48. An optical device according to claim 5, wherein the lenses are a light-transmitting semiconductor.

49. An optical device according to claim 1, wherein optical axis of the lenses coincide with an optical axis of an incident or emitting light of the optical active element.

* * * * *